United States Patent
Iyad Al Dibs et al.

(10) Patent No.: US 9,593,013 B2
(45) Date of Patent: Mar. 14, 2017

(54) MECHANICAL COMPONENT, MECHANICAL SYSTEM, AND METHOD FOR OPERATING A MECHANICAL COMPONENT

(71) Applicant: Robert Bosch GmbH, Stuttgart (DE)

(72) Inventors: Mohamad Iyad Al Dibs, Pliezhausen (DE); Frederic Njikam Njimonzie, Reutlingen (DE); Joerg Muchow, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 754 days.

(21) Appl. No.: 14/060,887

(22) Filed: Oct. 23, 2013

(65) Prior Publication Data

US 2014/0117888 A1    May 1, 2014

(30) Foreign Application Priority Data

Oct. 26, 2012 (DE) .................. 10 2012 219 650

(51) Int. Cl.
*B81C 99/00* (2010.01)
*G02B 26/08* (2006.01)

(52) U.S. Cl.
CPC ........ *B81C 99/003* (2013.01); *G02B 26/0833* (2013.01)

(58) Field of Classification Search
CPC .............. B81C 99/003; B81C 99/0035; G02B 26/0833; B81B 7/02; G01P 15/10; G10K 2210/129; G10K 2210/3211; B23Q 11/0039; G05B 2219/49048
See application file for complete search history.

(56) References Cited

U.S. PATENT DOCUMENTS

| 3,958,450 A | * | 5/1976 | Kleesattel | .............. G01N 3/405 |
| | | | | 73/573 |
| 2008/0246201 A1 | * | 10/2008 | Shibayama | .............. F16F 15/02 |
| | | | | 267/140.15 |
| 2016/0187226 A1 | * | 6/2016 | Tsutsui | ................ G01M 13/045 |
| | | | | 73/593 |

FOREIGN PATENT DOCUMENTS

| CN | 1945215 A | 4/2007 |
| CN | 1945216 A | 4/2007 |
| CN | 100564240 A | 4/2007 |
| CN | 102362152 A | 2/2012 |
| CN | 102378895 A | 3/2012 |
| DE | 10 2010 029 925 | 12/2011 |
| EP | 1 990 608 A2 | 11/2008 |

* cited by examiner

*Primary Examiner* — Nathan L Laughlin
(74) *Attorney, Agent, or Firm* — Gerard Messina

(57) ABSTRACT

A mechanical component has: a mount; an adjustable part selectively set at least into a first vibration mode having a first natural frequency and into a second vibration mode having a second natural frequency; a first sensor unit providing a first sensor signal; and a second sensor unit providing a second sensor signal. The first and second sensor units are interconnected in such a way that an overall signal is generated with the aid of at least the first and second sensor signals, the overall signal having an overall ratio of a first maximum absolute value which arises in the event of an excitation of the first vibration mode, and a second maximum absolute value which arises in the event of an excitation of the second vibration mode.

14 Claims, 15 Drawing Sheets

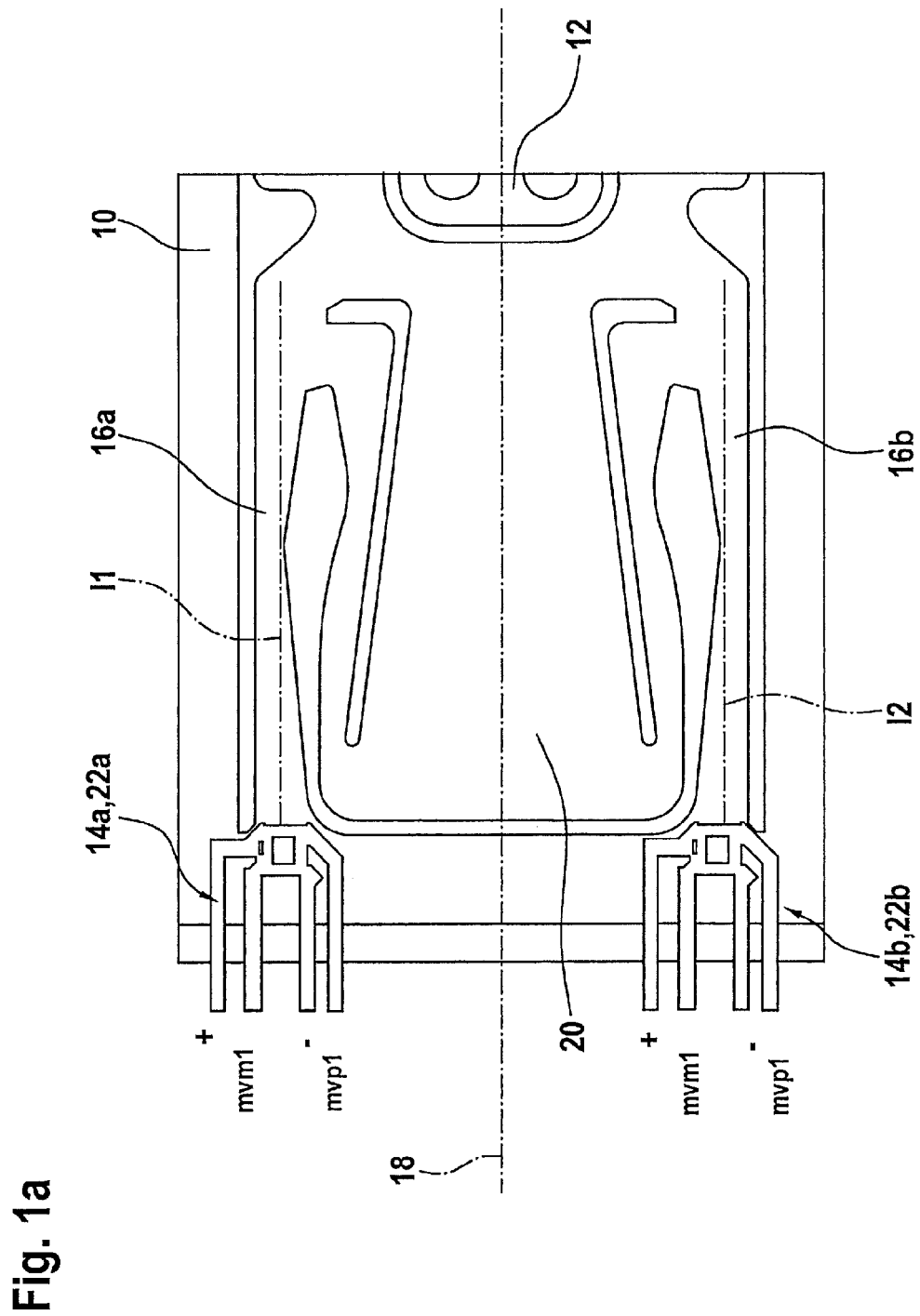

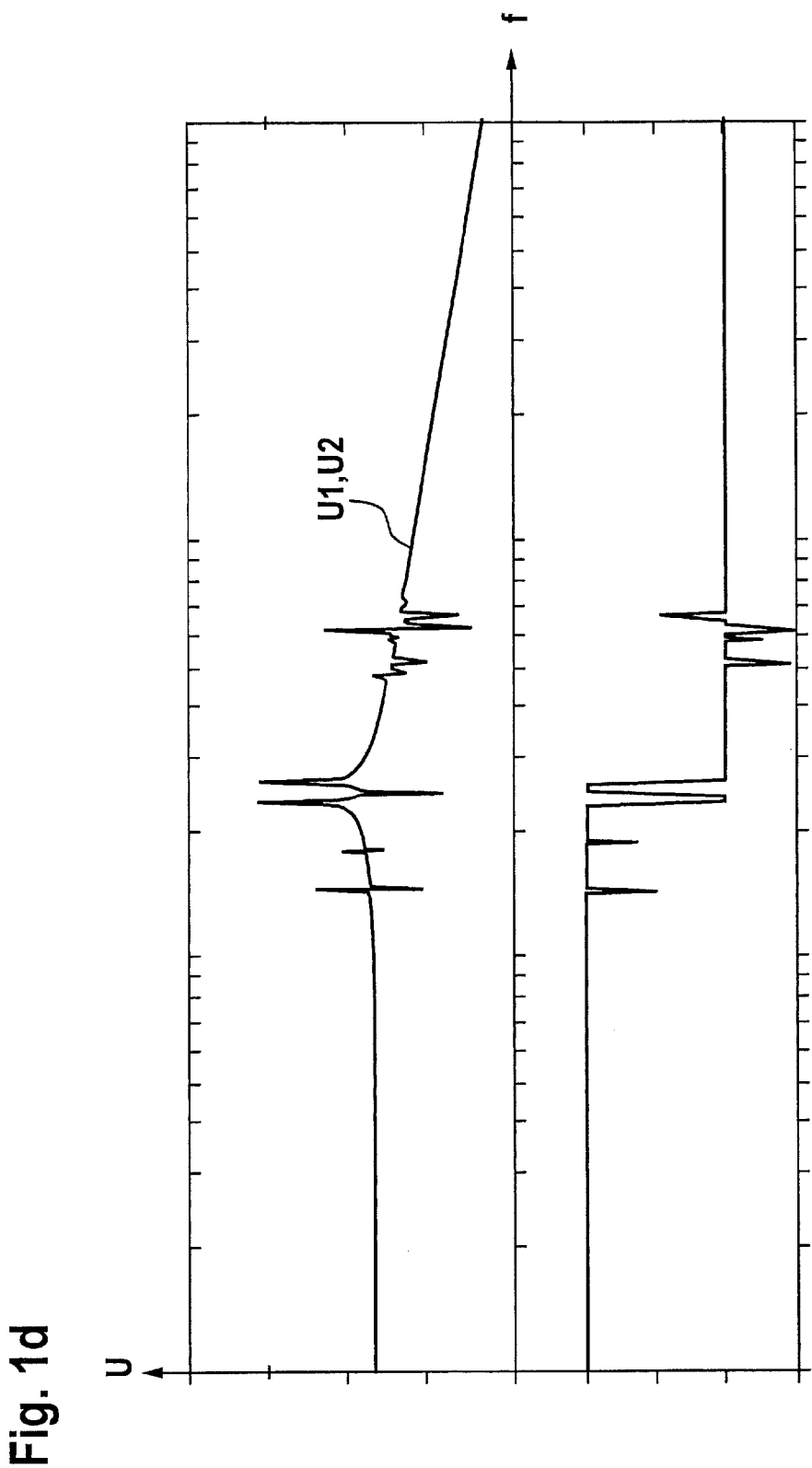

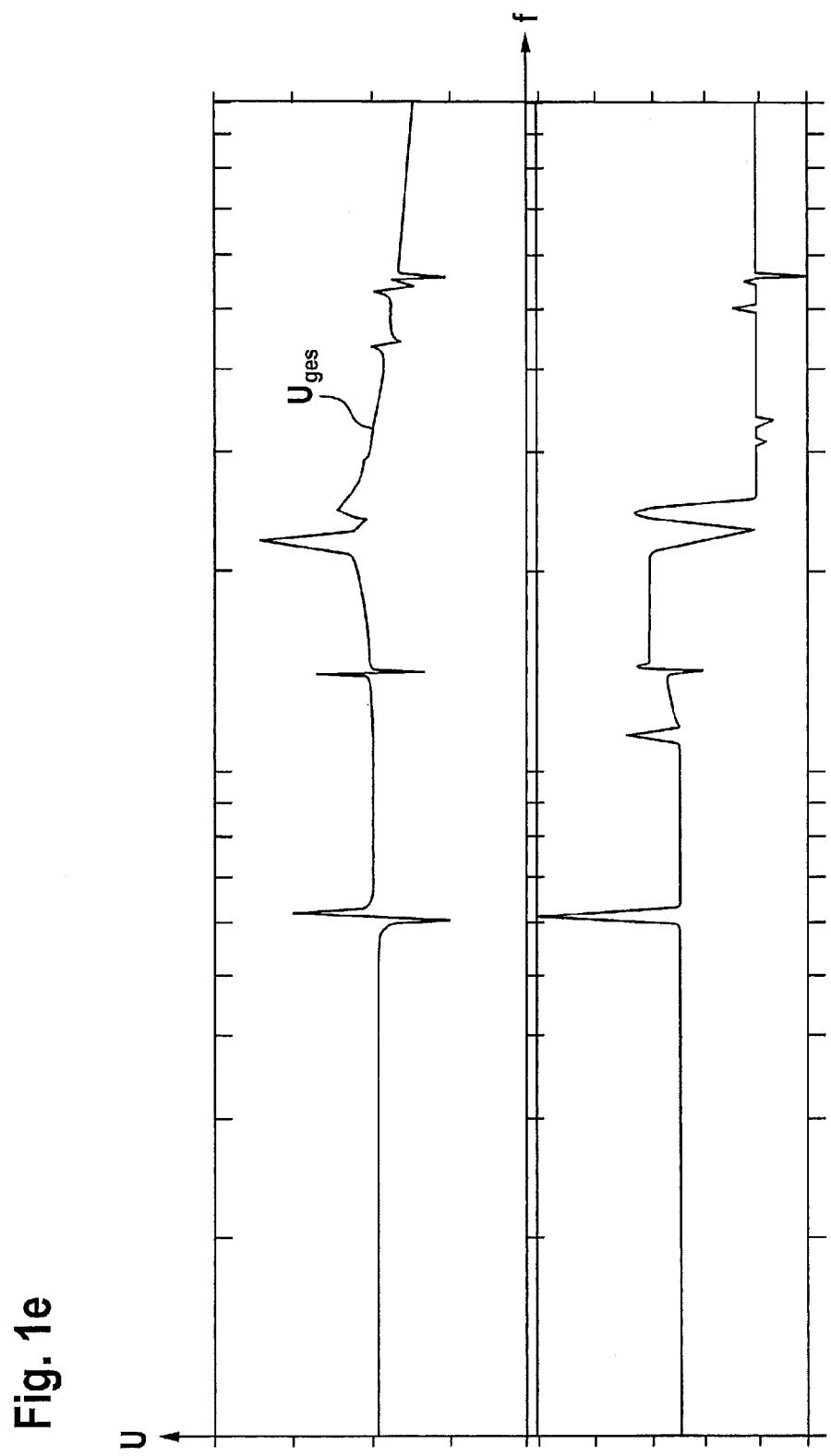

MECHANICAL COMPONENT, MECHANICAL SYSTEM, AND METHOD FOR OPERATING A MECHANICAL COMPONENT

BACKGROUND OF THE INVENTION

1. Field of the Invention

The present invention relates to a mechanical component and a mechanical system, as well as to a method for operating a mechanical component.

2. Description of the Related Art

A device and a method for position recognition of a vibrating microdevice are described in published German patent application document DE 10 2010 029 925 A1. The device has as an adjustable part a vibrating micromirror, which is connected via a suspension to a mount. For recognizing an instantaneous position of the micromirror, the device has four sensor units designed as microphones, with the aid of which sound waves, which are also caused in the event of an adjustment of the vibrating micromirror, are detectable as pressure changes.

BRIEF SUMMARY OF THE INVENTION

The present invention simplifies the ascertainment of the first natural frequency of the first vibration mode, which is preferably excited during operation of the mechanical component. As explained in greater detail hereafter, the easier recognizability of the first natural frequency of the first vibration mode significantly reduces the requirements on a control and/or regulating device which cooperates with the mechanical component. Therefore, the mechanical component may be used together with a control and/or regulating device which is more cost-effective and requires less available space.

The first natural frequency is not to be understood as a natural frequency which is less than the second natural frequency. The first natural frequency may therefore also be greater than the second natural frequency. The designations "first natural frequency" and "second natural frequency," and also "first vibration mode" and "second vibration mode" are only used to differentiate the natural frequencies and vibration modes.

Preferably, the first vibration mode is a useful mode and the second vibration mode is an interference mode. With the aid of an advantageous interconnection of the at least two sensor units, an overall signal may be generated, which reproduces the excitation of the useful mode in amplified form, while the excitation of the interfering mode is only weakly reproduced, and preferably completely suppressed. In particular, the overall signal may only reproduce the excitation of the useful mode, while, in the case of the at least one interfering mode, the various partial sensor signals cancel/erase each other out. Any arbitrary mode of the mechanical component may be selected as a useful mode.

In one advantageous specific embodiment, the first maximum absolute value of the overall signal is greater than or equal to a sum of the first maximum absolute value of the first sensor signal and the first maximum absolute value of the second sensor signal, the second maximum absolute value of the overall signal being less than or equal to the difference between the second maximum absolute value of the first sensor signal and the second maximum absolute value of the second sensor signal. An increase of the first maximum absolute value, which is assigned to the first vibration mode, is therefore implemented, while the second maximum absolute value, which is assigned to the second vibration mode, is (nearly) filtered out. This makes it easier to recognize the first natural frequency, to which a comparatively high value of the overall signal may be assigned with the first maximum absolute value.

The output signal of a sensor unit is frequently an electrical voltage. A UI transducer in a circuit may be used for an addition of voltage signals.

The mechanical component may be a micromechanical component, for example. In particular in the case of micromechanical components, natural frequencies of a system made of an adjustable part and a mount are frequently excited, to thus ensure a relatively large adjustment movement of the adjustable part. The present invention may therefore also contribute to more cost-effective manufacturing and/or an improved field of application of micromechanical components.

In another advantageous specific embodiment, the adjustable part is connected to the mount via at least one first spring and one second spring, which are implemented as symmetrical to one another with respect to a plane of symmetry. In particular in-phase or counter-phase deflections of the first spring and the second spring may therefore be utilized for the purpose, via the suitable implementation and interconnection of the two sensor units, of significantly increasing the overall signal value which is assignable to the first vibration mode in relation to the overall signal value which is assigned to the second vibration mode.

The first sensor unit is preferably implemented on a first anchor of the first spring on the mount and/or on the first spring, the second sensor unit being implemented on a second anchor of the second spring on the mount and/or on the second spring. This makes electrical contacting of the sensor units significantly easier.

For example, the first vibration mode is asymmetrical with respect to the plane of symmetry (counter-phase, 180° phase-shifted), while the second vibration mode is symmetrical (in-phase) with respect to the plane of symmetry, the overall signal being generated as a differential voltage from a first voltage signal provided as a first sensor signal and from a second voltage signal provided as a second sensor signal. This allows an (automatic) amplification of the overall signal value assigned to the first vibration mode, while simultaneously averaging out/damping the overall signal value assignable to the second vibration mode.

The first vibration mode may also be symmetrical (in-phase) with respect to the plane of symmetry and the second vibration mode may be asymmetrical (counter-phase, 180° phase-shifted) with respect to the plane of symmetry, the overall signal being generated with the aid of a UI transducer as an "added-together voltage signal" from a first voltage signal provided as a first sensor signal and from a second voltage signal provided as a second sensor signal. The advantages described in the above paragraph are also implementable in this way.

In one advantageous refinement, a drive body of the mechanical component is suspended on the mount via the first spring and the second spring, the adjustable part being connected via at least one intermediate spring to the drive body. As explained in greater detail hereafter, in this system made of the drive body and the adjustable part, which may be set into various vibrating movements in relation to the mount, easy recognition of the previously used first vibration mode in relation to further modes is possible on the basis of the overall signal.

In one advantageous specific embodiment, the first sensor unit is a first full bridge and the second sensor unit is a second full bridge. The first sensor unit may also be a first-half bridge and the second sensor unit may be a homopolar second half bridge. As an alternative thereto, the first sensor unit may be a first-half bridge and the second sensor unit may be a second half bridge having opposite polarization. Capacitive and/or inductive detectors may also be used for the first sensor unit and/or the second sensor unit. The mechanical component described here may therefore be optimized for its particular intended purpose using a plurality of different sensor types.

The above-described advantages are also ensured in the case of a mechanical system having a corresponding mechanical component and a regulating device, the regulating device being designed for the purpose of ascertaining a frequency, for which the overall signal, which is provided as a frequency spectrum, has an unambiguous maximum, establishing the ascertained frequency as a first natural frequency, and setting the adjustable part into a vibration movement identical to the first vibration mode in consideration of the established first natural frequency. The unambiguous maximum may be understood, for example, as a maximum greater than a predefined threshold value and/or having a phase shift of the summation output signal in relation to the exciting signal of 90° (with deviations in a range of 1°), which is found at first by the regulating device. The regulating device may therefore recognize the suitable maximum from the set of the local maxima as first, for example, since the suitable maximum has the greatest amplitude or an unambiguous phase shift of 90° in comparison to the other local maxima. Therefore, the preferably used first vibration mode may be intentionally excited in the mechanical system.

In particular, the regulating device may include a phase-locked loop. Such a regulating device is implementable cost-effectively and requires comparatively little available space.

Furthermore, the above-described advantages are also ensured by an execution of a corresponding method for operating a mechanical component.

BRIEF DESCRIPTION OF THE DRAWINGS

FIGS. 1a through 1e show a schematic partial view of a first specific embodiment of the mechanical component and four coordinate systems to explain its mode of operation.

DETAILED DESCRIPTION OF THE INVENTION

Figure 1B:
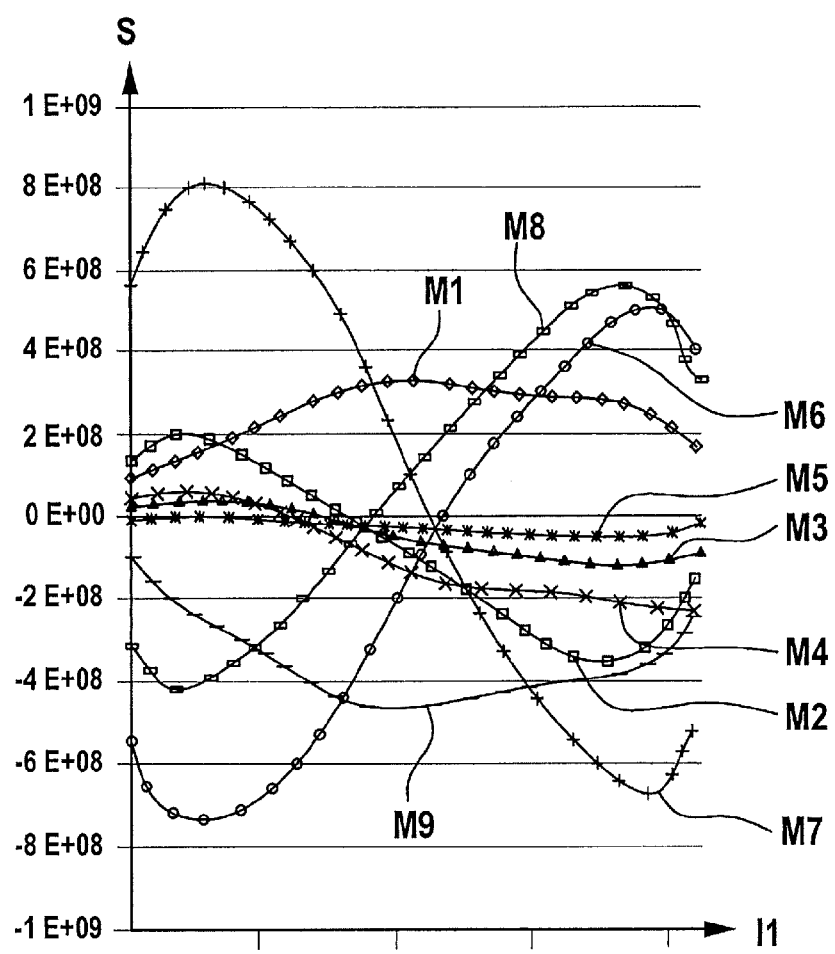

FIGS. 1a through 1e show a schematic partial view of a first specific embodiment of the mechanical component and four coordinate systems to explain its mode of operation.

The mechanical component which is partially shown in FIG. 1a has a mount 10 and an adjustable part 12, adjustable part 12 being connected to mount 10 in such a way that adjustable part 12, in relation to mount 10, may be set at least into one first vibration mode having a first natural frequency and into one second vibration mode having a second natural frequency, which is not equal to the first natural frequency. Adjustable part 12 may be a mirror plate, for example. The mechanical component is therefore implementable as a mirror device, in particular as a micromirror. Instead of a mirror plate, however, an adjustable part 12 which is designed differently may also be used. For example, the mechanical component may also be a yaw rate sensor or an acceleration sensor. The implementability of the mechanical component is not limited to a specific adjustable part 12. The frame-type implementation of mount 10 shown in FIG. 1a is also only to be interpreted as an example.

The mechanical component preferably has an actuator unit (not shown), with the aid of which adjustable part 12 may be excited into a vibration movement having a frequency (in relation to the mount), which is variable within a predefined frequency value range, the frequency value range at least including the first natural frequency and the second natural frequency. The actuator unit may include, for example, as an electrostatic actuator unit, at least one electrode and/or, as a magnetic actuator unit, at least one coil. In addition, at least one piezo element may be used as part of an actuator unit on the mechanical component. The actuator types listed here are only to be interpreted as examples for the implementation of the actuator unit, however. In particular, the mechanical component described here is not limited to a specific type of a usable actuator unit.

A first sensor unit 14a, with the aid of which a first sensor signal may be provided, is situated on the mechanical component, the first sensor signal having a first ratio of a first maximum absolute value of the first sensor signal, which occurs in the event of an excitation of the first vibration mode of adjustable part 12, and a second maximum absolute value of the first sensor signal, which occurs in the event of an excitation of the second vibration mode of adjustable part 12. In addition, the mechanical component also has a second sensor unit 14b, with the aid of which a second sensor signal may be provided. Sensor units 12 and 14 may include, for example, at least one strain gauge, one piezoresistive sensing unit, one piezoelectric sensing unit, one capacitive sensing unit, and/or one inductive sensing unit. The implementation forms listed here for sensor units 12 and 14 are only to be interpreted as examples, however.

The second sensor signal has a second ratio of a first maximum absolute value of the second sensor signal, which occurs in the event of an excitation of the first vibration mode of adjustable part 12, and a second maximum absolute value of the second sensor signal, which occurs in the event of an excitation of the second vibration mode of adjustable part 12. The first ratio and the second ratio may be a first quotient and a second quotient, for example. Advantageous possible designs for the two sensor units 14a and 14b are described in greater detail hereafter.

First sensor unit 14a and second sensor unit 14b are interconnected with one another in such a way that an overall signal may be generated with the aid of at least the first sensor signal and the second sensor signal. For example, a UI transducer may be used for generating the overall signal. However, the overall signal may also be a differential voltage. Further exemplary embodiments of the overall signal which may be generated are also possible.

The overall signal has an overall ratio of a first maximum absolute value of the overall signal, which occurs in the event of an excitation of the first vibration mode of adjustable part 12, and a second maximum absolute value of the overall signal, which occurs in the event of an excitation of the second vibration mode of adjustable part 12, which is greater than the first ratio of the first sensor signal and is greater than the second ratio of the second sensor signal. The overall ratio may also be a quotient, for example.

A response of the mechanical component to an excitation of the first vibration mode is thus intentionally amplified at the overall signal. This makes it easier to recognize the reaction of the mechanical component to the excitation of the first vibration mode and/or the assignment of a frequency as a first natural frequency. As explained in greater detail hereafter, this property of the overall signal may be utilized for a plurality of possible uses.

In particular, the first vibration mode may be intentionally used as a useful mode. Since a response of the mechanical component to the excitation of the second vibration mode is (automatically) quenched/suppressed in the overall signal, it is advantageous if the second vibration mode is an interfering mode. As explained in greater detail hereafter, multiple useful modes (as the at least one first vibration mode) may also be increased in the overall signal, while multiple interfering modes (as the at least one second vibration mode) are suppressed/quenched.

In the specific embodiment which is partially shown in FIG. 1a, adjustable part 12 is connected via at least one first spring 16a and one second spring 16b to mount 10. First spring 16a and second spring 16b are designed symmetrically to one another with respect to a plane of symmetry 18. Springs 16a and 16b may also be designated as drive springs or working springs. In the specific embodiment shown in FIG. 1a, springs 16a and 16b are implemented to be comparatively long. Such long springs ensure a good adjustability of drive body 20 and adjustable part 12 attached thereon, and also a comparatively low mechanical stress while adjustable part 12 is set into one of its at least two vibration modes. In particular, springs 16a and 16b may be designed as L-shaped deflectable bending springs. However, equipping the mechanical component with such springs 16a and 16b is merely optional.

In addition, in the case of the specific embodiment partially shown in FIG. 1a, a drive body 20 of the mechanical component is suspended via first spring 16a and second spring 16b on mount 10. At least one partial component of the actuator unit, for example a coil and/or an electrode, may be situated on drive body 20. In addition, adjustable part 12 is connected via at least one intermediate spring (not shown) to drive body 20. However, equipping the mechanical component with the two springs 16a and 16b and drive body 20, which is shown in FIG. 1a, is only to be understood as an example in each case.

Drive body 20 and adjustable part 12 may vibrate in multiple degrees of freedom in relation to mount 10. These vibration movements of drive body 20 and adjustable part 12 may be oriented in particular around a common axis of rotation (not shown). In particular, drive body 20 and adjustable part 12 may also vibrate in relation to one another. This may also be rewritten to say that drive body 20 and adjustable part 12 have vibrations in which they vibrate in parallel to one another or in counter phase.

Figure 1C:
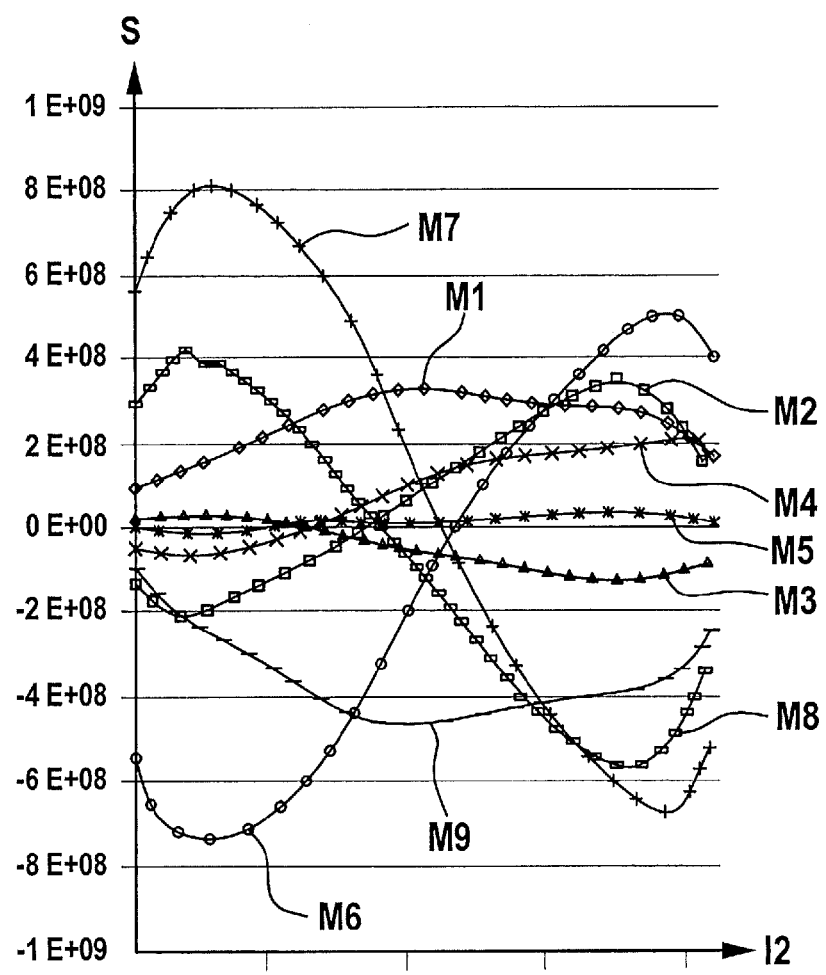

In the coordinate systems of FIGS. 1b and 1c, the total of nine (first) vibration modes M1 through M9 of the mechanical component are shown. The abscissa of FIG. 1b extends along a first longitudinal axis I1 of first spring 16a from an anchor of first spring 16a on mount 10 to an anchor of first spring 16a on drive body 20. Correspondingly, the abscissa of the coordinate system of FIG. 1c represents a second longitudinal axis 12, which is guided by second spring 16b, and which begins at an anchor of second spring 16b on mount 10 and ends at an anchor of second spring 16b on drive body 20. The ordinates of the coordinate systems of FIGS. 1b and 1c each show the (maximum) mechanical tensions arising during vibration modes M1 through M9 as a mechanical stress S.

As is apparent on the basis of FIGS. 1b and 1c, springs 16a and 16b are bent in an S-shape in the case of the vibration modes in M2, M6, M7, and M8. However, the S-shaped deflections of springs 16a and 16b are only symmetrical with respect to axis of symmetry 18 in the case of the vibration modes in M6 and M7. In contrast, the S-shaped deflections of springs 16a and 16b are asymmetrical in the case of vibration modes M2 and M8. One may also refer to a phase-shifted deflection or an opposing deflection of springs 16a and 16b in the case of vibration modes M2 and M8.

With the aid of the implementation and interconnection of sensor units 14a and 14b, the signal of the at least one first vibration mode, which is preferred over further vibration modes M1 through M9, may intentionally be amplified from vibration modes M1 through M9 in the overall signal. An advantageous arrangement of first sensor unit 14a is ensured, for example, if first sensor unit 14a is implemented on the anchor of first spring 16a on mount 10 and/or on first spring 16a. Correspondingly, second sensor unit 14b may also advantageously be implemented on the anchor of second spring 16b on mount 10 and/or on second spring 16b. Such an arrangement of at least one sensor unit 14a and 14b permits reliable recognition of an occurring deformation of the at least one assigned spring 16a and 16b and simpler inference of the adjustment movement of adjustable part 12 thus caused.

In the specific embodiment partially shown in FIG. 1a, sensor units 14a and 14b are each attached at an assigned anchoring area of springs 16a and 16b to mount 10 and/or close to the anchoring area on one spring 16a and 16b. The arrangement of at least one sensor unit 14a and 14b on an anchor of at least one spring 16a and 16b on mount 10 is additionally linked to the advantage that no contacts/lines are required via particular springs 16a and 16b. Therefore, the bending properties of particular springs 16a and 16b are not impaired by running lines.

In the specific embodiment of FIG. 1a, two full bridges 22a and 22b composed of piezo-sensitive measuring resistors are implemented on the anchors of the two springs 16a and 16b as sensor units 14a and 14b. Sensor units 14a and 14b may also be designated as Wheatstone bridges. Due to the mechanical stresses and the piezo-resistive effects arising therein during deflection of springs 16a and 16b, the resistors of full bridges 22a and 22b change their respective resistance value. This resistance change may be read out on the basis of a provided voltage. The ability to implement the mechanical component is not limited to a specific sensor type, however.

FIG. 1d shows a coordinate system having a voltage signal, which may be provided as a first sensor signal U1 or a second sensor signal U2, in a frequency spectrum. The abscissa of FIG. 1d shows an excitation frequency f, at which adjustable part 12 vibrates in relation to mount 10. The ordinate specifies a voltage U, which may be provided as a first sensor signal U1 or a second sensor signal U2.

As is apparent on the basis of FIG. 1d, first sensor signal U1 or second sensor signal U2 has a plurality of local maxima and local minima. The plurality of extreme values in the coordinate system of FIG. 1d makes it more difficult to operate the mechanical component in the preferred vibration mode. In addition, it is hardly possible to assign a specific natural frequency to the preferred vibration modes on the basis of the many local extreme values. It is also to be taken into consideration that manufacturing tolerances may shift frequency bands in such a way that establishing the natural frequencies of the preferred vibration modes for the operation of the mechanical component may hardly be executed itself with the aid of comparatively complex electronics. Furthermore, an aging process on the mechanical component may make reestablishing the natural frequencies of the preferred vibration modes for the operation of the mechanical component much more difficult.

With the aid of a suitable establishment of the starting voltages of sensor units 14a and 14b, which are implemented as full bridges 22a and 22b, however, the overall signal of the at least one vibration mode which is preferred for the operation of the mechanical component may be intentionally amplified. In particular, it may be taken into consideration that a symmetrical deformation of springs 16a and 16b with respect to plane of symmetry 18 generally causes a first sensor signal U1 (nearly) identical to second sensor signal U2, while in the event of an opposing/phase shifted deformation of springs 16a and 16b, first sensor signal U1 is conventionally opposite to second sensor signal U2. This is frequently ensured, independently of whether the deflection of springs 16a and 16b is an S-shaped deflection or another type of deflection.

For the intentional suppression of undesirable signals of the at least one overall signal of the at least one vibration mode, which is symmetrical with respect to plane of symmetry 18, sensor units 14a and 14b may therefore be interconnected with one another in such a way that a sum of first sensor signal U1 and second sensor signal U2 is output as an overall signal. In this case, a second sensor signal U2, which is (nearly) opposite to first sensor signal U1, cancels out first sensor signal U1. In this way, the overall signals of symmetrical vibration modes M6 and M7 are intentionally amplified in relation to those of vibration modes M2 and M8, which are opposing/phase-shifted in a strongly pronounced way.

If at least one opposing/phase-shifted vibration mode is preferred for the operation of the mechanical component, sensor units 14a and 14b may also be interconnected in such a way that a differential voltage of the two full bridges 22a and 22b is provided as an overall signal. This causes (automatic) filtering out of vibration modes having a first sensor signal U1 (nearly) equal to a second sensor signal U2. For example, in this way, the overall signals of vibration modes M2 and M8 may be amplified in relation to those of vibration modes M6 and M7, while vibration modes M6 and M7 are (automatically) filtered out/quenched.

FIG. 1e shows an advantageous overall signal Uges. The abscissa of FIG. 1e specifies an excitation frequency f, using which adjustable part 12 is excited in relation to mount 10, while the ordinate corresponds to voltage U, which may be provided as overall signal Uges. The comparison of FIGS. 1d and 1e shows the effect of filtering by the two full bridges 22a and 22b. The frequency spectrum of the two full bridges 22a and 22b shown in FIG. 1e is already filtered of some interfering modes.

Due to the reduced number of the strongly pronounced peaks, recognizing the preferred vibration modes for the operation of the mechanical component and assignment of their natural frequency itself may be executed rapidly and reliably with the aid of cost-effective electronics.

Figure 2A:
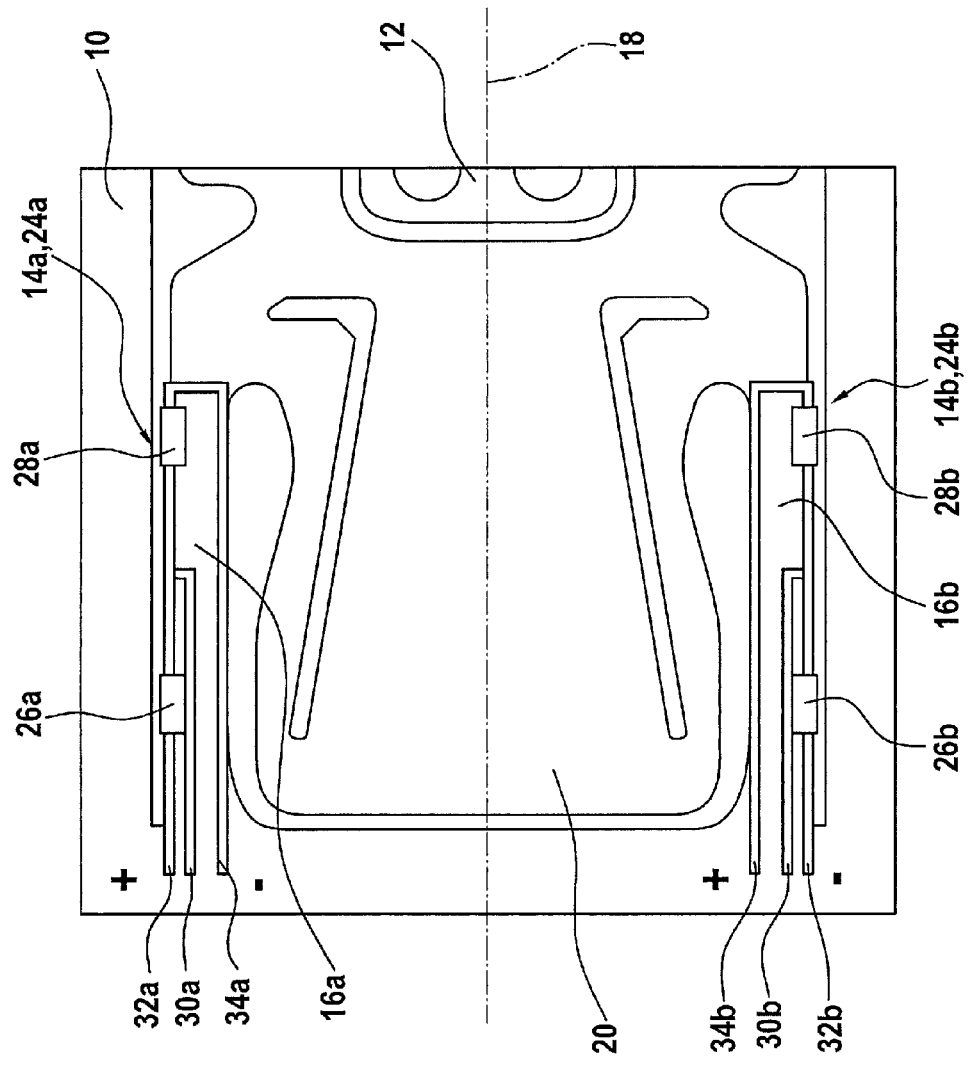
FIGS. 2a and 2b show a schematic partial view of a second specific embodiment of the mechanical component and a coordinate system to explain its mode of operation.
Figure 2B:
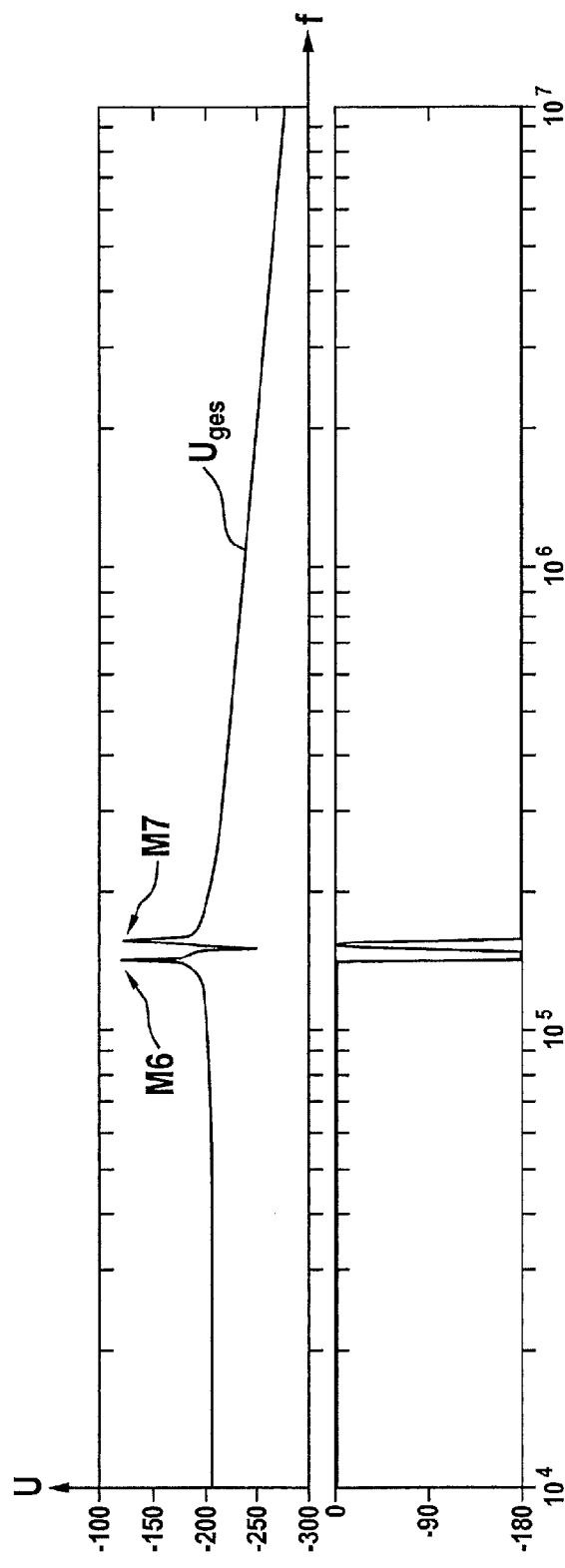

FIGS. 2a and 2b show a schematic partial view of a second specific embodiment of the mechanical component and a coordinate system to explain its mode of operation.

The mechanical component which is partially schematically shown in FIG. 2a has as sensor units 14a and 14b a first half bridge 24a and a second half bridge 24b. Each of the two half bridges 24a and 24b is positioned on a spring 16a or 16b assigned thereto in such a way that a first resistor 26a or 26b of half bridge 24a or 24b lies on and/or in a first half of assigned spring 16a or 16b, which is attached to mount 10, while a second resistor 28a or 28b of half bridge 24a or 24b is situated on and/or in a second half of a sign spring 16a or 16b, which is attached to drive body 20 or adjustable part 12. This ensures that in the event of an S-shaped deflection of particular spring 16a or 16b, only one resistor 26a, 26b, 28a, or 28b of one half bridge 24a and 24b in each case is in a traction zone of spring 16a or 16b, while other resistor 26a, 26b, 28a, or 28b of the same half bridge 24a and 24b is in a compression zone of particular spring 16a or 16b. Therefore, in particular in the case of above-mentioned vibration modes M2, M6, M7, and M8, a noticeable potential difference may be tapped/measured at bridge tap 30a and 30b. Vibration modes M6 and M7, which are symmetrical with respect to plane of symmetry 18, cause a rectified potential shift at the two half bridges 24a and 24b, while the potential shifts arising in the case of opposing/phase-shifted vibration modes M2 and M8 are opposed.

In the specific embodiment shown in FIG. 2a, the two half bridges 24a and 24b have opposite/inverse polarity. An opposite/inverse polarity of the two half bridges 24a and 24b may be understood to mean that a first potential is applied to first resistor 26a of first half bridge 24a and to second resistor 28b of second half bridge 24b, while a second potential, which deviates from the first potential, is applied to second resistor 28a of first half bridge 24a and to first resistor 26b of second half bridge 24b. This is implemented in particular by applying the first potential to a first contact 32a of first half bridge 24a, which is assigned to first resistor 26a of first bridge 24a, and to a second contact 34b of second half bridge 24b, which is assigned to second resistor 28b of second half bridge 24b, and by applying the second potential to a second contact 34a of first half bridge 24a, which is assigned to second resistor 28a of first half bridge 24a, and to a first contact 32b of second half bridge 24b, which is assigned to first resistor 26b of second half bridge 24b. In the event of an opposite/inverse polarity of the two half bridges 24a and 24b, in particular overall signals Uges, which are assignable to vibration modes M6 and M7, are amplified, while the sensor signals of vibration modes M2 and M8 cancel each other out in overall signal Uges. In this way, the frequency spectrum shown in FIG. 2b is obtained, whose abscissa and ordinate correspond to the axes of FIG. 1e. An opposite/inverse polarity of the two half bridges 24a and 24b is therefore advantageous, if adjustable part 12 is to be adjusted with the aid of intentional exciting of one of the two vibration modes M6 and M7.

FIGS. 3a through 3g show schematic views of a third specific embodiment of the mechanical component and coordinate systems to explain its mode of operation.

Figure 3A:
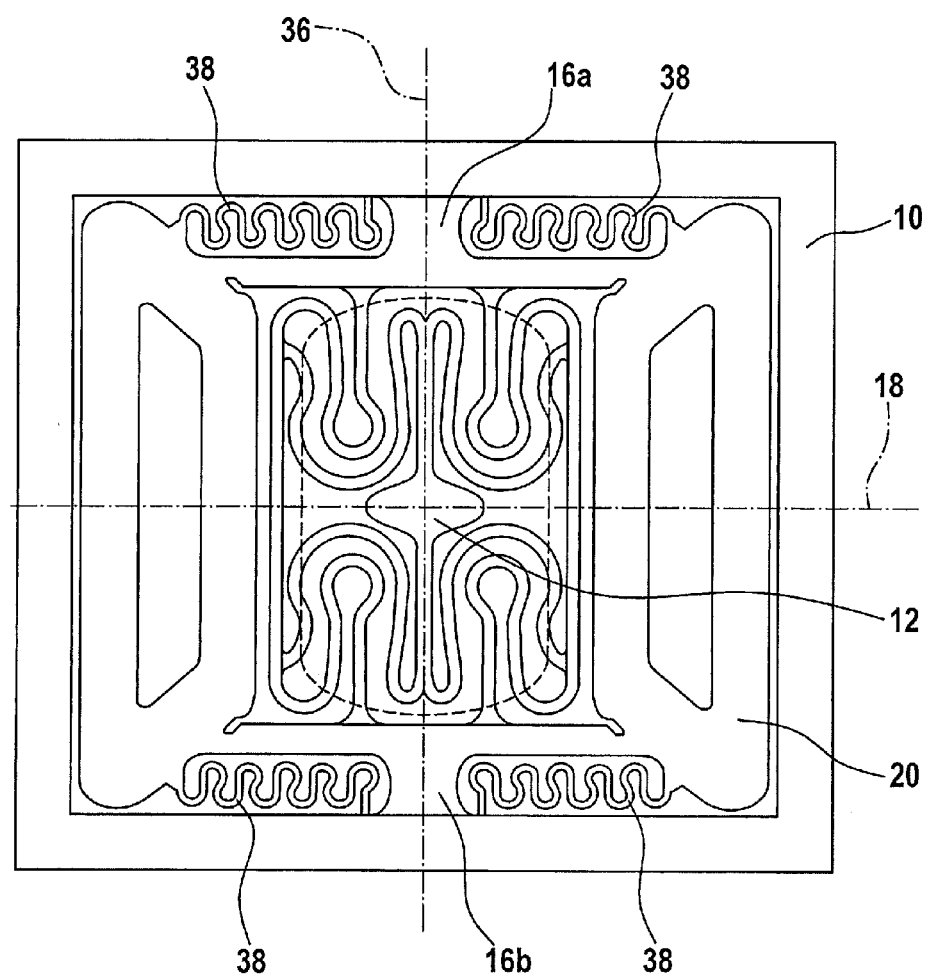
FIGS. 3a through 3g show schematic views of a third specific embodiment of the mechanical component and coordinate systems to explain its mode of operation.
Figure 3B:
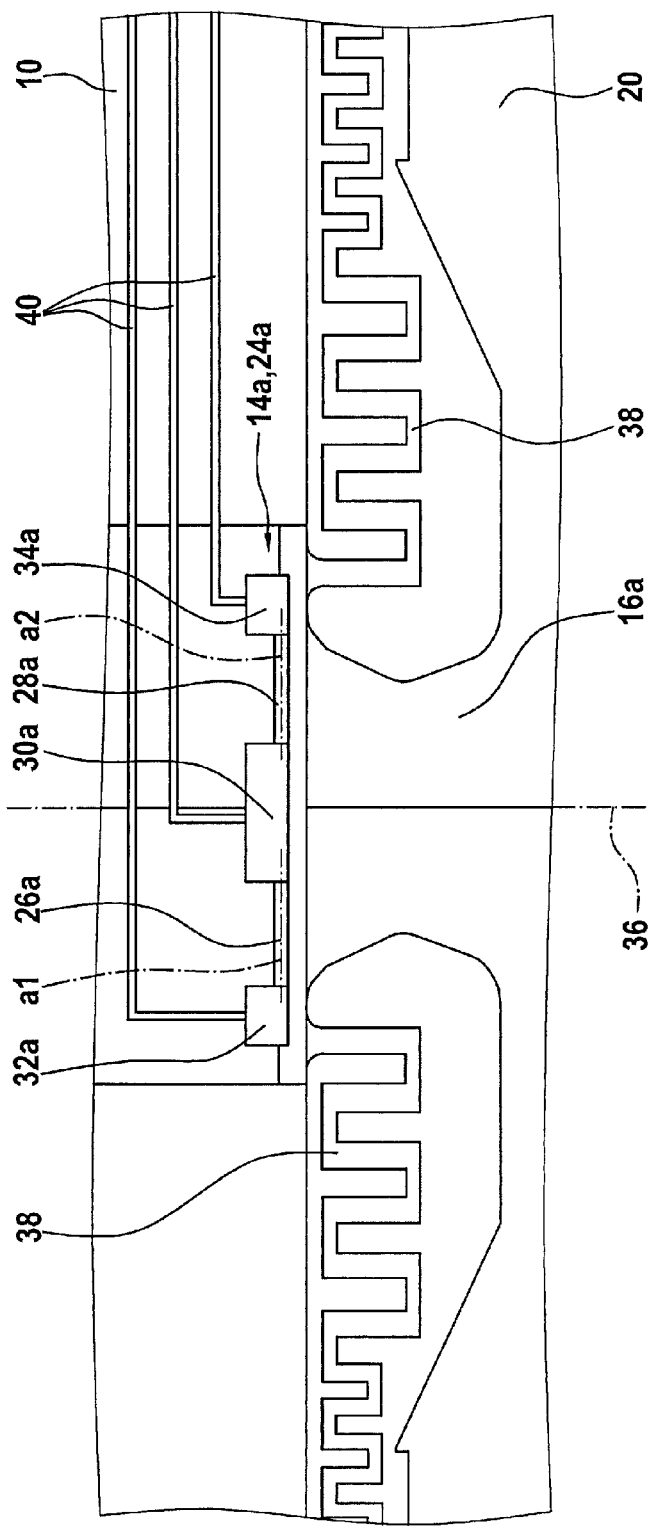
Figure 3C:
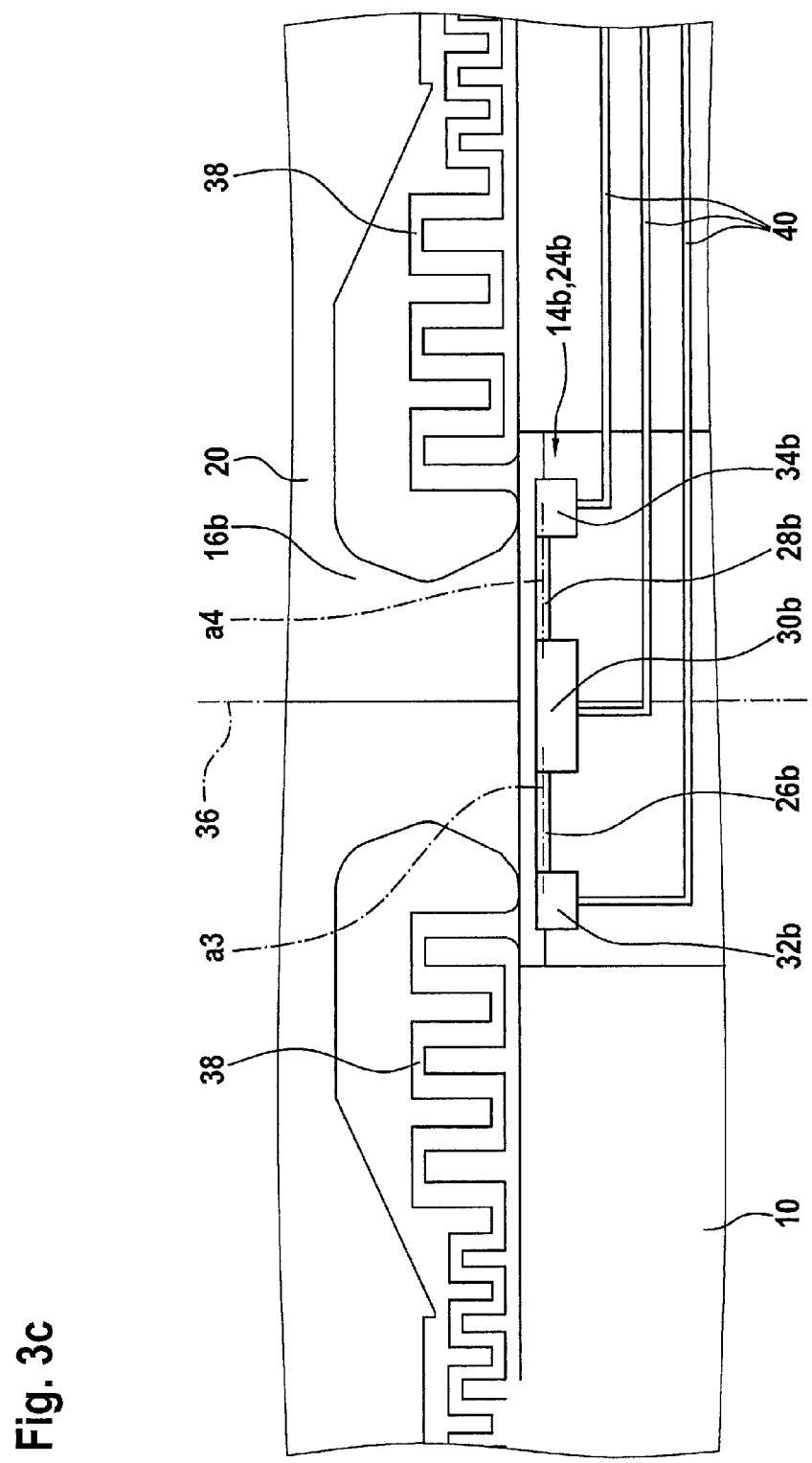
Figure 3D:
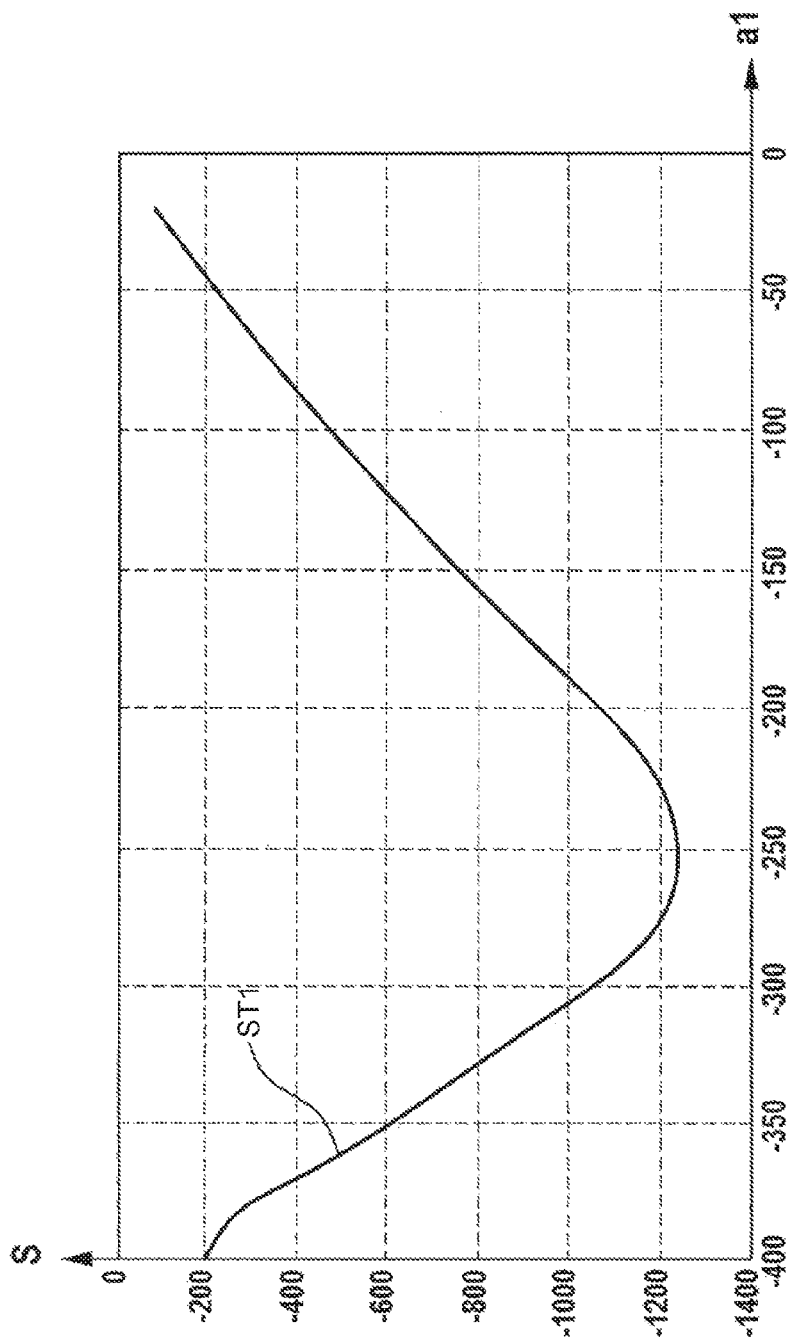
Figure 3E:
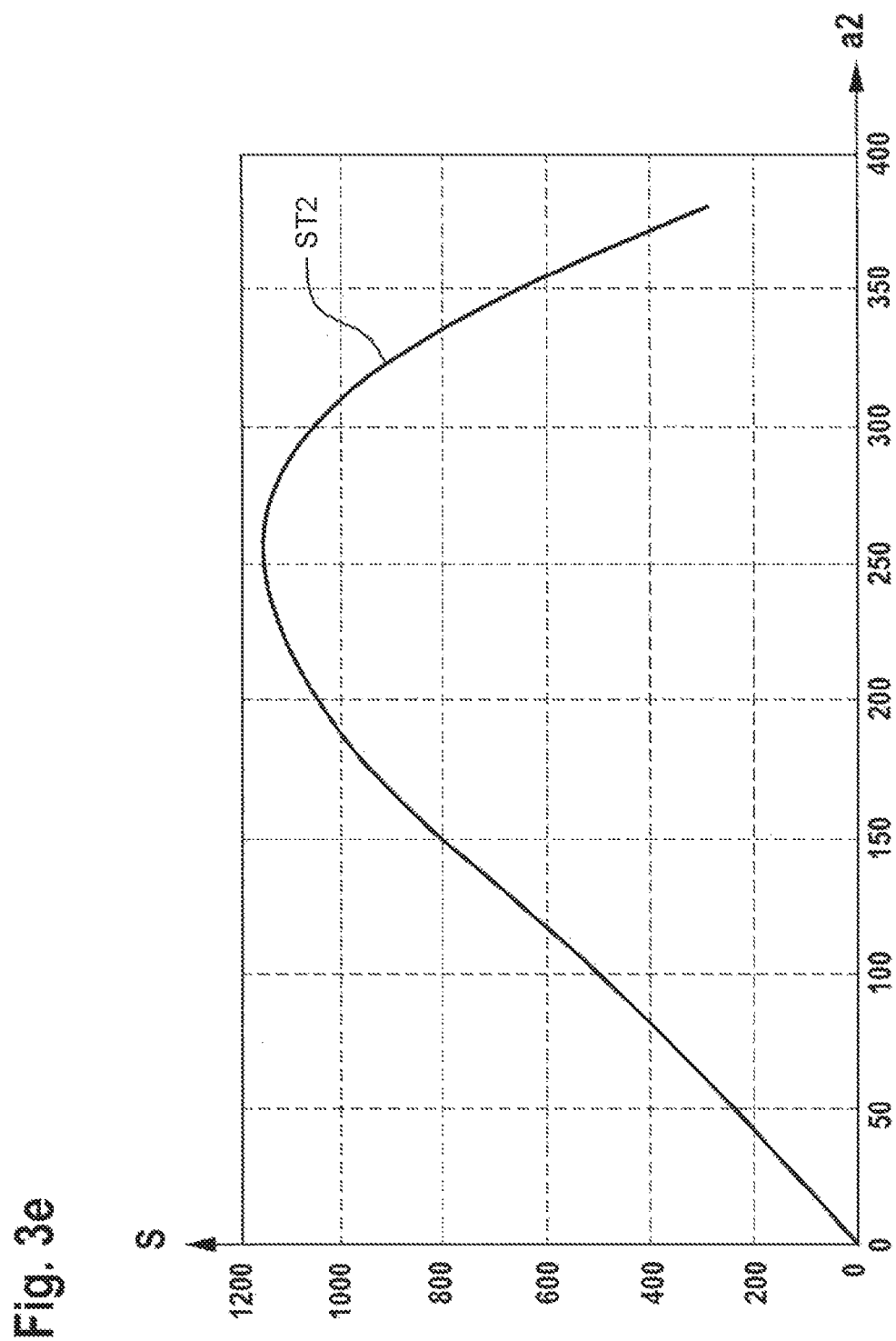
Figure 3F:
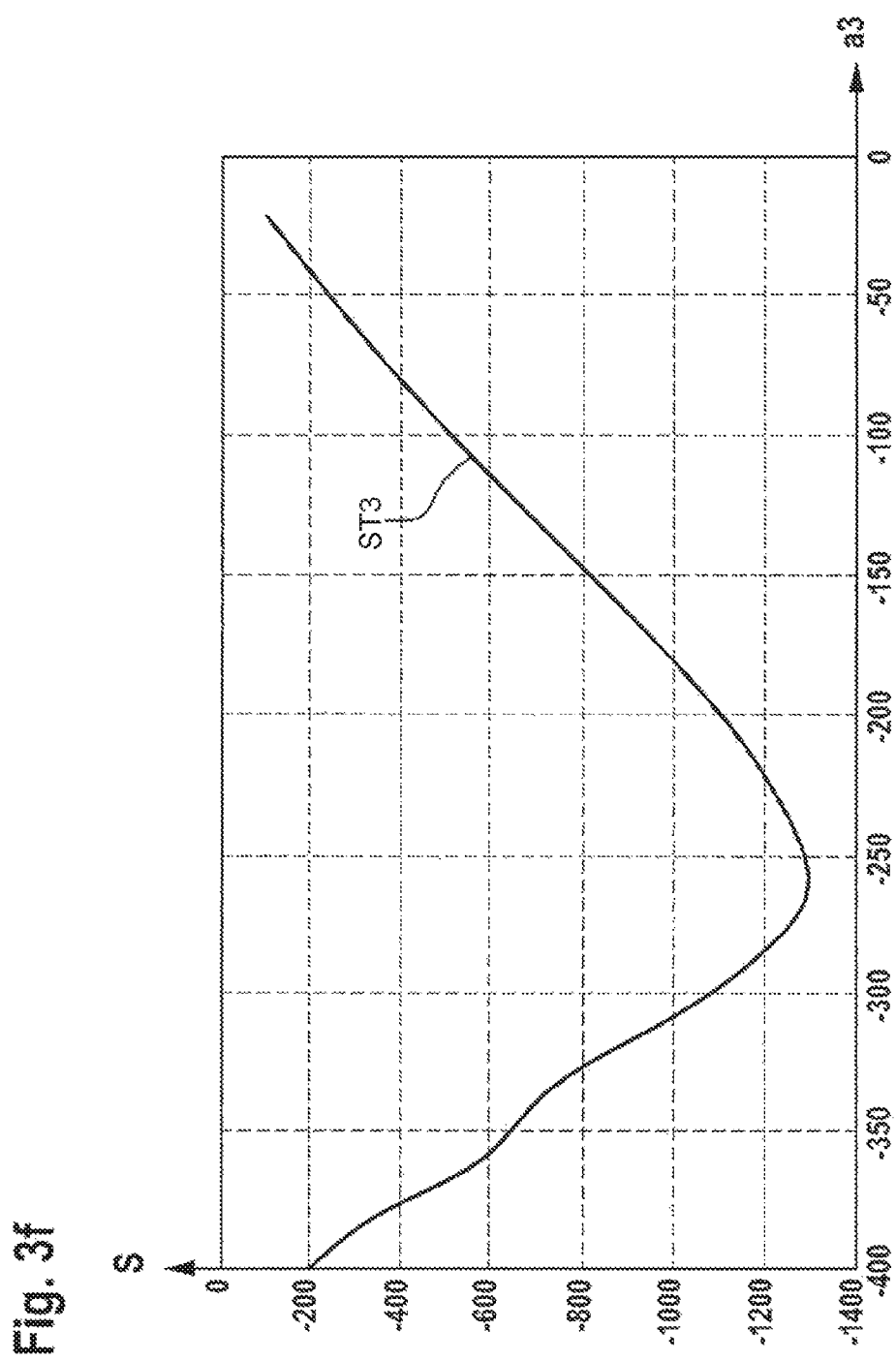
Figure 3G:
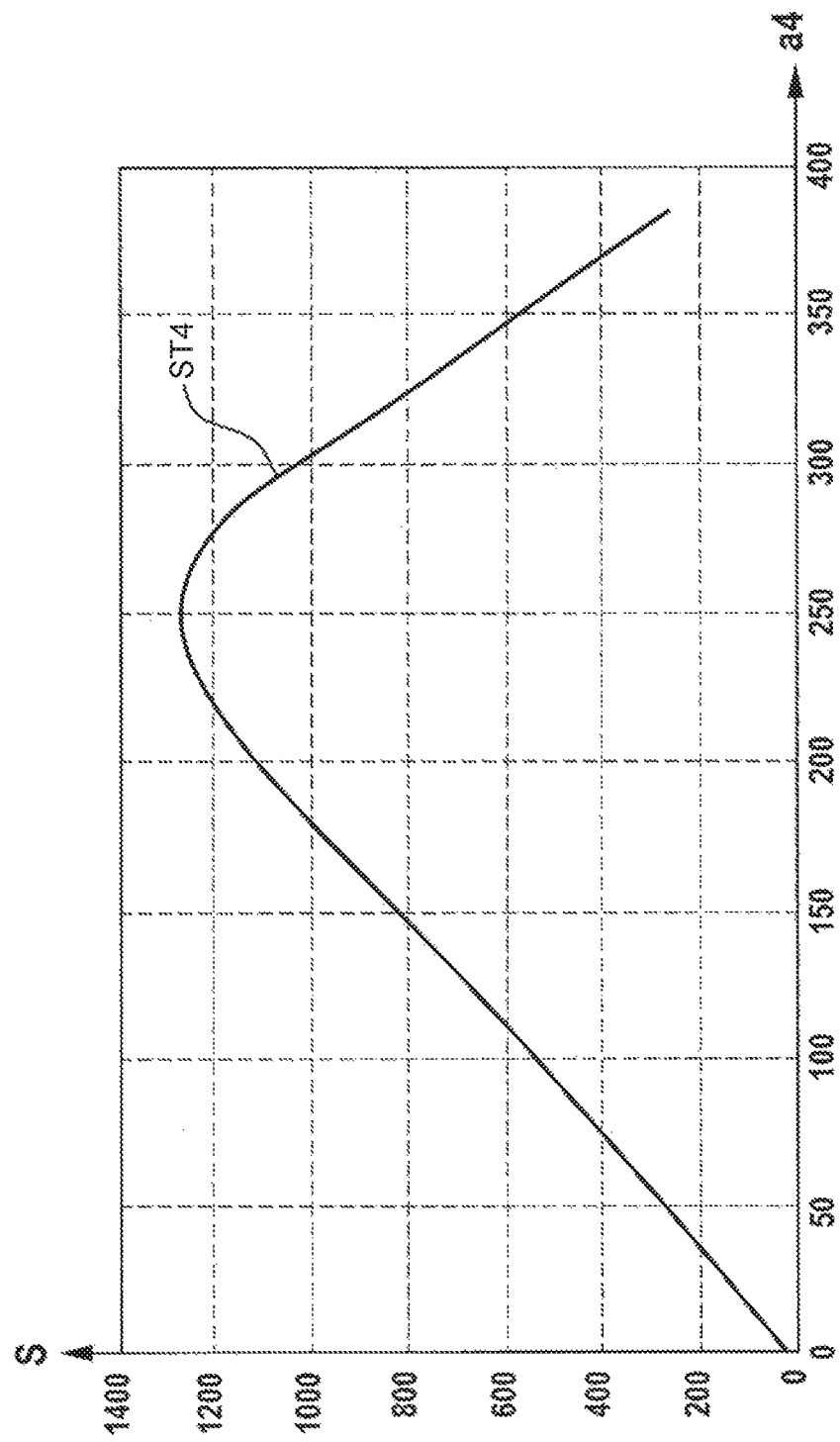

The mechanical component, which is shown in its entirety in FIG. 3a and partially in FIGS. 3b and 3c, has in each case a torsion spring, whose bending axis 36 extends along springs 16a and 16b, in each case as first spring 16a and as second spring 16b. Bending axis 36 is preferably aligned perpendicularly to plane of symmetry 18. In addition, the mechanical component also has four further meandering springs 38, the function of which is not relevant for understanding the further statements, however.

A sensor unit 14a and 14b, which is implemented as a half bridge 24a and 24b, is arranged on the anchoring area of a spring 16a and 16b with mount 10 and/or close to the anchoring area and/or in spring 16a and 16b. A first resistor 26a and 26b of each half bridge 24a and 24b in each case lies on a first side of bending axis 36, while second resistor 28a and 28b of identical half bridge 24a or 24b lies on the other side of bending axis 36. Preferably, first resistors 26a and 26b extend from an assigned first contact 32a or 32b along a longitudinal axis a1 or a3, which is aligned perpendicularly to bending axis 36, to a bridge tap 30a or 30b of particular half bridge 24a and 24b. Second resistors 28a and 28b may also extend from an assigned second contact 34a or 34b along a longitudinal axis a2 or a4, which is aligned perpendicularly to bending axis 36, to bridge tap 30a or 30b of particular half bridge 24a or 24b. The contacting of resistors/piezo-resistors 26a, 26b, 28a, or 28b is easily executable, since feed lines 40 are only to be guided via mount 10. Since no mechanical stress arises in mount 10, damage to feed lines 40 during the operation of the mechanical component is reliably prevented.

FIGS. 3d through 3g show coordinate systems for representing mechanical stresses ST1 through ST4, which arise in the event of a torsion of the two springs 16a and 16b around bending axis 36, the abscissas showing longitudinal axes a1 through a4 (in μm) and the ordinates showing mechanical tension S (in Mpa).

As is apparent on the basis of coordinate systems 3d through 3g, in the event of the torsion of the two springs 16a and 16b around bending axis 36, only one resistor 26a, 26b, 28a, or 28b of in each case one half bridge 24a and 24b lies in a traction zone of spring 16a or 16b, while other resistor 26a, 26b, 28a, or 28b of the same half bridge 24a and 24b lies in a compression zone of particular spring 16a and 16b. Therefore, a noticeable potential difference may be tapped/measured at bridge tabs 30a and 30b. The above-described implementation of half bridges 24a and 24b is therefore very advantageous for use on at least one spring 16a and 16b, which is used as a torsion spring.

With the aid of opposite polarization of the two half bridges 24a and 24b, the overall signal may be automatically generated in such a way that a high overall signal is generated for a natural vibration of adjustable part 12/drive body 20. At the same time, it may be ensured that the extremes of the individual sensor signals, which are not of interest for the useful modes, cancel each other out. The specific embodiment of FIGS. 3a through 3c therefore also ensures the above-described advantages.

It is to be noted that above-described piezoresistive bridges 22a, 22b, 24a, and 24b have the advantage that they are comparatively free of interference and provide a linear signal.

Figure 4:
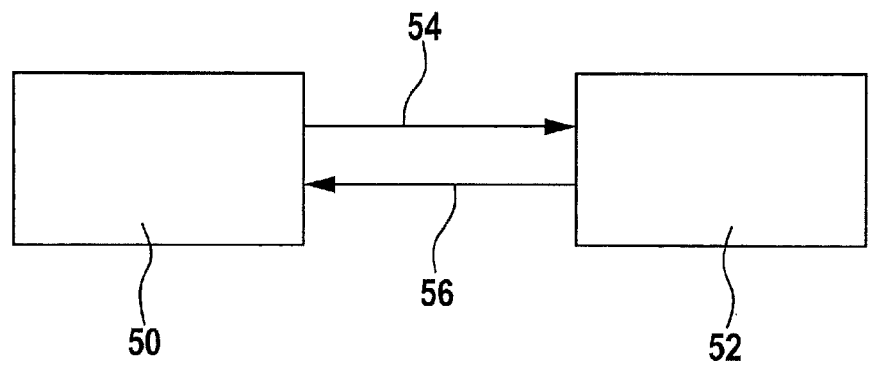
FIG. 4 shows a schematic view of one specific embodiment of the mechanical system.

FIG. 4 shows a schematic view of one specific embodiment of the mechanical system.

The mechanical system which is schematically shown in FIG. 4 includes a mechanical component 50 and a regulating device 52. Mechanical component 50 is one of the above-described specific embodiments, for example. The implementability of the mechanical system is not limited thereto, however. Regulating device 52 is designed for the purpose of ascertaining a frequency, for which overall signal 54, which is provided as a frequency spectrum, has a suitable maximum. Reference is made to the above statements with respect to the definition of a suitable maximum. The frequency ascertained in this way is subsequently established/reestablished as a first natural frequency. Regulating device 52 then activates mechanical component 50 with the aid of a control signal 56 in such a way that the adjustable part is set into a vibration movement identical to the first vibration mode (for example, a useful mode) while taking into consideration the established first natural frequency.

Regulating device 52 may include, for example, a phase-locked loop (PLL). With the aid of such a phase-locked loop, a phase angle and, related thereto, the frequency of the variable oscillator may be influenced via a closed control loop in such a way that the smallest possible phase deviation is achieved between an external reference signal and the oscillator. The first vibration mode (as a useful mode) may be intentionally activated with the aid of such feedback.

The advantageous design of regulating device 52 described in the above paragraph offers reliable feedback to ascertain a deflection of the adjustable part as a function of the activated frequency. Since only the at least one useful mode preferably occurs in overall signal 54, an interfering mode may not be excited. Therefore, it is sufficient for the activation of the mechanical component to design the electronics of regulating device 52 in such a way that the modes, the signals of which are fed back, are excited. The analysis of the frequency spectrum provided as overall signal 54 may therefore be carried out with the aid of simply designed electronics of regulating device 52.

Figure 5:
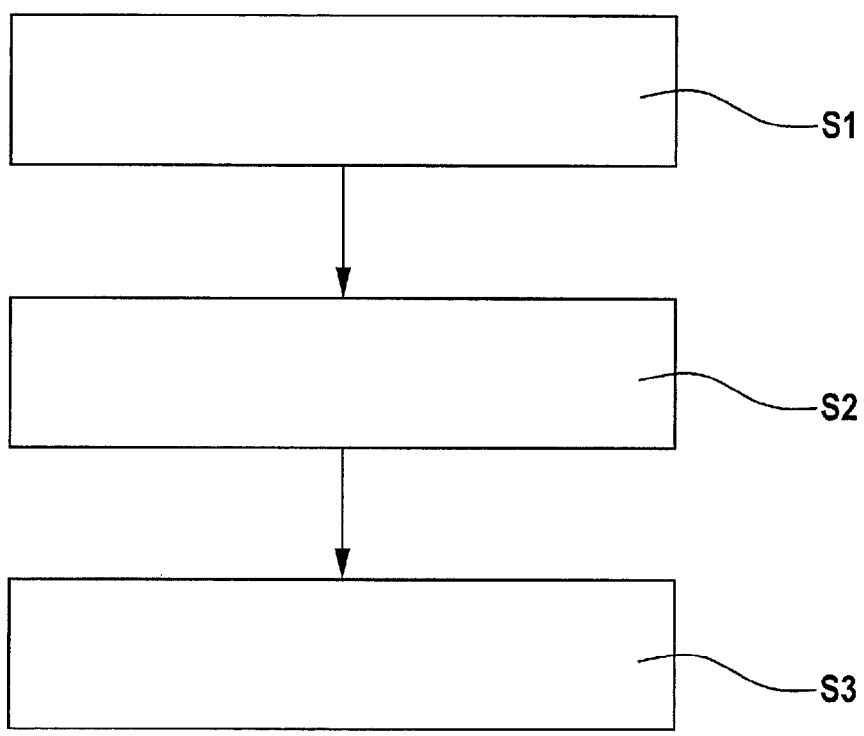
FIG. 5 shows a flow chart to explain one specific embodiment of the method for operating a mechanical component.

FIG. 5 shows a flow chart to explain one specific embodiment of the method for operating a mechanical component.

The method is executable while employing a mechanical component having a mount, an adjustable part, an actuator unit, a first sensor unit, and a second sensor unit. For example, the above-described specific embodiments may be used for executing the method. However, the ability to execute the method is not limited thereto.

In a method step S1, the adjustable part is set into vibration movements in relation to the mount with the aid of the actuator unit, a frequency of the vibration movements being varied within a predefined frequency value range. The frequency spectrum preferably includes a useful frequency of a useful mode of the adjustable part and one or multiple interfering frequencies of one or multiple interfering modes of the adjustable part. (The frequency value range therefore includes a first natural frequency of a first vibration mode of the adjustable part and a second natural frequency of a second vibration mode of the adjustable part.) The first sensor unit provides, during method step S1, a first sensor signal, which has a first ratio of a first maximum absolute value of the first sensor signal, which arises in the event of an excitation of the first vibration mode of the adjustable part, and a second maximum absolute value of the first sensor signal, which arises in the event of an excitation of the second vibration mode of the adjustable part. Correspondingly, the second sensor unit provides, during method step S1, a second sensor signal, which has a second ratio of a first maximum absolute value of the second sensor signal, which arises in the event of an excitation of the first vibration mode of the adjustable part, and a second maximum absolute value of the second sensor signal, which arises in the event of an excitation of the second vibration mode of the adjustable part. The first sensor unit and the second sensor unit, which are interconnected with one another, generate, during method step S1, with the aid of at least the first sensor signal and the second sensor signal, an overall signal, which has strongly suppressed interfering modes of the adjustable part having negligible maximum absolute values in relation to the useful mode of the adjustable part having a high maximum absolute value. This may also be rewritten to say that the overall signal has an overall ratio of a first maximum absolute value of the overall signal, which arises in the event of an excitation of the first vibration mode of the adjustable part, and a second maximum absolute value of the overall signal, which arises in the event of an excitation of the second vibration mode of the adjustable part, which is greater than the first ratio of the first sensor signal and greater than the second ratio of the second sensor signal.

Subsequently, in a method step S2, a frequency is ascertained, for which the overall signal provided as a frequency spectrum has a suitable maximum. The unambiguous maximum may be understood, for example, as a maximum greater than a predefined threshold value and/or having a phase shift of 90° (with deviations in a range of 1°). The suitable maximum is, for example, the maximum fulfilling these properties having the smallest frequency or having the greatest frequency. If the search for the suitable maximum is started proceeding from lower frequencies, the suitable maximum has the smallest frequency. Otherwise it has the greatest frequency. The ascertained frequency is established/reestablished as a first natural frequency.

In a further method step S3, the adjustable part is set into a vibration movement identical to the first vibration mode, excitation being performed using the established/reestablished first natural frequency. The method therefore ensures the above-described advantages.

What is claimed is:

1. A mechanical component, comprising:
   a mount;
   an adjustable part connected to the mount in such a way that the adjustable part is selectively set in relation to the mount at least into a first vibration mode having a first natural frequency and into a second vibration mode having a second natural frequency different from the first natural frequency;
   a first sensor unit providing a first sensor signal having a first ratio of a first maximum absolute value of the first sensor signal which arises in the event of an excitation of the first vibration mode of the adjustable part and a second maximum absolute value of the first sensor signal which arises in the event of an excitation of the second vibration mode of the adjustable part; and
   a second sensor unit providing a second sensor signal having a second ratio of a first maximum absolute value of the second sensor signal which arises in the event of an excitation of the first vibration mode of the adjustable part and a second maximum absolute value of the second sensor signal which arises in the event of an excitation of the second vibration mode of the adjustable part;
   wherein the first sensor unit and the second sensor unit are interconnected with one another to generate an overall signal with the aid of at least the first and second sensor signals, the overall signal having an overall ratio of a first maximum absolute value of the overall signal which arises in the event of an excitation of the first vibration mode of the adjustable part and a second maximum absolute value of the overall signal which arises in the event of an excitation of the second vibration mode of the adjustable part, and wherein the overall ratio is greater than the first ratio of the first sensor signal and greater than the second ratio of the second sensor signal.

2. The mechanical component as recited in claim 1, wherein the first maximum absolute value of the overall signal is greater than or equal to a sum of the first maximum absolute value of the first sensor signal and the first maximum absolute value of the second sensor signal, and wherein the second maximum absolute value of the overall signal is less than or equal to a difference between the second maximum absolute value of the first sensor signal and the second maximum absolute value of the second sensor signal.

3. The mechanical component as recited in claim 2, wherein the mechanical component is a micromechanical component.

4. The mechanical component as recited in claim 2, wherein the adjustable part is connected to the mount via a first spring and a second spring, and wherein the first and second springs are implemented symmetrically to one another with respect to a plane of symmetry.

5. The mechanical component as recited in claim 4, wherein (i) the first sensor unit is implemented on at least one of the first spring and a first anchor of the first spring on the mount, and (ii) the second sensor unit is implemented on at least one of the second spring and a second anchor of the second spring on the mount.

6. The mechanical component as recited in claim 4, wherein the first vibration mode is asymmetrical with respect to the plane of symmetry and the second vibration mode is symmetrical with respect to the plane of symmetry, and wherein the overall signal is generated as a differential voltage based on a first voltage signal provided as the first sensor signal and a second voltage signal provided as the second sensor signal.

7. The mechanical component as recited in claim 4, wherein the first vibration mode is symmetrical with respect to the plane of symmetry and the second vibration mode is asymmetrical with respect to the plane of symmetry, and wherein the overall signal is generated with the aid of a transducer as a combined voltage signal based on a first voltage signal provided as the first sensor signal and a second voltage signal provided as the second sensor signal.

8. The mechanical component as recited in claims 4, further comprising:
   a drive body suspended on the mount via the first spring and the second spring, wherein the adjustable part is connected to the drive body via at least one intermediate spring.

9. The mechanical component as recited in claim 4, wherein the first sensor unit is a first full bridge and the second sensor unit is a second full bridge.

10. The mechanical component as recited in claim 4, wherein the first sensor unit is a first half bridge and the second sensor unit is a homopolar second half bridge.

11. The mechanical component as recited in claim 4, wherein the first sensor unit is a first half bridge and the second sensor unit is a second half bridge having opposite polarity.

12. A mechanical system, comprising:
    a mechanical component which includes:
      a mount;
      an adjustable part connected to the mount in such a way that the adjustable part is selectively set in relation to the mount at least into a first vibration mode having a first natural frequency and into a second vibration mode having a second natural frequency different from the first natural frequency;
      a first sensor unit providing a first sensor signal having a first ratio of a first maximum absolute value of the first sensor signal which arises in the event of an excitation of the first vibration mode of the adjustable part and a second maximum absolute value of the first sensor signal which arises in the event of an excitation of the second vibration mode of the adjustable part; and a second sensor unit providing a second sensor signal having a second ratio of a first maximum absolute value of the second sensor signal which arises in the event of an excitation of the first vibration mode of the adjustable part and a second maximum absolute value of the second sensor signal which arises in the event of an excitation of the second vibration mode of the adjustable part;

wherein the first sensor unit and the second sensor unit are interconnected with one another to generate an overall signal with the aid of at least the first and second sensor signals, the overall signal having an overall ratio of a first maximum absolute value of the overall signal which arises in the event of an excitation of the first vibration mode of the adjustable part and a second maximum absolute value of the overall signal which arises in the event of an excitation of the second vibration mode of the adjustable part, and wherein the overall ratio is greater than the first ratio of the first sensor signal and greater than the second ratio of the second sensor signal; and a regulating device configured to: (i) ascertain a frequency for which the overall signal has an unambiguous maximum, wherein the overall signal is provided as a frequency spectrum; (ii) establish the ascertained frequency as a first natural frequency; and (iii) set the adjustable part into a vibration movement identical to the first vibration mode in consideration of the established first natural frequency.

13. The mechanical system as recited in claim 12, wherein the regulating device includes a phase-locked loop.

14. A method for operating a mechanical component having a mount, an adjustable part, an actuator unit, a first sensor unit, and a second sensor unit, the method comprising:

setting the adjustable part into vibration movements in relation to the mount with the aid of the actuator unit, a frequency of the vibration movements being varied within a predefined frequency value range which includes a first natural frequency of a first vibration mode of the adjustable part and a second natural frequency of a second vibration mode of the adjustable part;

providing by the first sensor unit a first sensor signal which has a first ratio of a first maximum absolute value of the first sensor signal which arises in the event of an excitation of the first vibration mode of the adjustable part and a second maximum absolute value of the first sensor signal which arises in the event of an excitation of the second vibration mode of the adjustable part;

providing by the second sensor unit a second sensor signal which has a second ratio of a first maximum absolute value of the second sensor signal which arises in the event of an excitation of the first vibration mode of the adjustable part and a second maximum absolute value of the second sensor signal which arises in the event of an excitation of the second vibration mode of the adjustable part;

generating, by the first sensor unit and the second sensor unit which are interconnected with one another, an overall signal based on at least the first sensor signal and the second sensor signal, wherein the overall signal is a frequency spectrum and has an overall ratio of a first maximum absolute value of the overall signal which arises in the event of an excitation of the first vibration mode of the adjustable part and a second maximum absolute value of the overall signal which arises in the event of an excitation of the second vibration mode of the adjustable part, and wherein the overall ratio is greater than the first ratio of the first sensor signal and greater than the second ratio of the second sensor signal;

ascertaining a frequency for which the overall signal has an unambiguous maximum;

establishing the ascertained frequency as a first natural frequency; and setting the adjustable part into a vibration movement identical to the first vibration mode, using the established first natural frequency.

* * * * *